United States Patent [19]

Bazes

[11] Patent Number: 4,937,476
[45] Date of Patent: Jun. 26, 1990

[54] SELF-BIASED, HIGH-GAIN DIFFERENTIAL AMPLIFIER WITH FEEDBACK

[75] Inventor: Mel Bazes, Haifa, Israel

[73] Assignee: Intel Corporation, Santa Clara, Calif.

[21] Appl. No.: 462,879

[22] Filed: Jan. 2, 1990

Related U.S. Application Data

[63] Continuation of Ser. No. 207,668, Jun. 16, 1988, abandoned.

[51] Int. Cl.$^5$ .................. H03K 17/04; H03K 17/687; H03K 19/017; H03K 19/094

[52] U.S. Cl. .................................. 307/475; 307/451; 307/482; 307/578; 307/585; 307/362; 307/296.8; 330/277; 330/253

[58] Field of Search ............... 307/448, 450, 451, 475, 307/494, 496, 497, 500, 355, 358, 360, 362, 482, 576, 578, 579, 584, 585, 605, 264, 296.1, 296.4, 296.8, 471; 330/253, 277

[56] References Cited

U.S. PATENT DOCUMENTS

| | | | |
|---|---|---|---|
| 3,914,702 | 10/1975 | Gehweiler | 307/451 X |
| 4,074,150 | 2/1978 | Buckley et al. | 307/471 X |
| 4,074,151 | 2/1978 | Buckley et al. | 307/471 X |
| 4,430,582 | 2/1984 | Bose et al. | 307/475 X |
| 4,437,024 | 3/1984 | Wacyk | 307/475 |
| 4,438,352 | 3/1984 | Mardkha | 307/451 X |
| 4,477,736 | 10/1984 | Onishi | 307/475 X |
| 4,563,595 | 1/1986 | Bose | 307/475 X |
| 4,677,321 | 6/1987 | Bacrania | 307/475 |

Primary Examiner—Stanley D. Miller
Assistant Examiner—David R. Bertelson
Attorney, Agent, or Firm—Blakely, Sokoloff, Taylor & Zafman

[57] ABSTRACT

A self-biased, high-gain differential amplifier which is substantially immune to process and temperature variations. A first pair of CMOS transistors is coupled to operate in an active region and an output from the common junction is coupled to drive a second pair of CMOS transistors. The second pair of CMOS transistors have their outputs coupled to provide a negative feedback to the first pair of CMOS transistors. A third pair of CMOS transistors is coupled in parallel to the first pair of CMOS transistors for accepting an input signal and generating an output, wherein the output is a function of the input signal in relation to a reference voltage. A fourth pair of CMOS transistors is coupled to be driven by the third pair of CMOS transistors and provides a CMOS compatible signal which switches between two CMOS logic states.

12 Claims, 7 Drawing Sheets

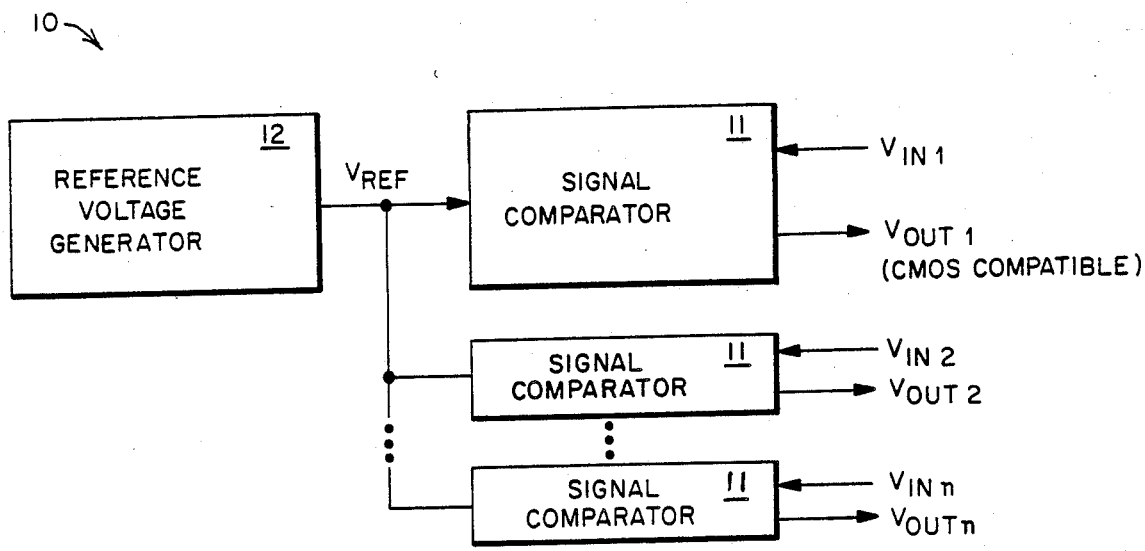
FIG_1
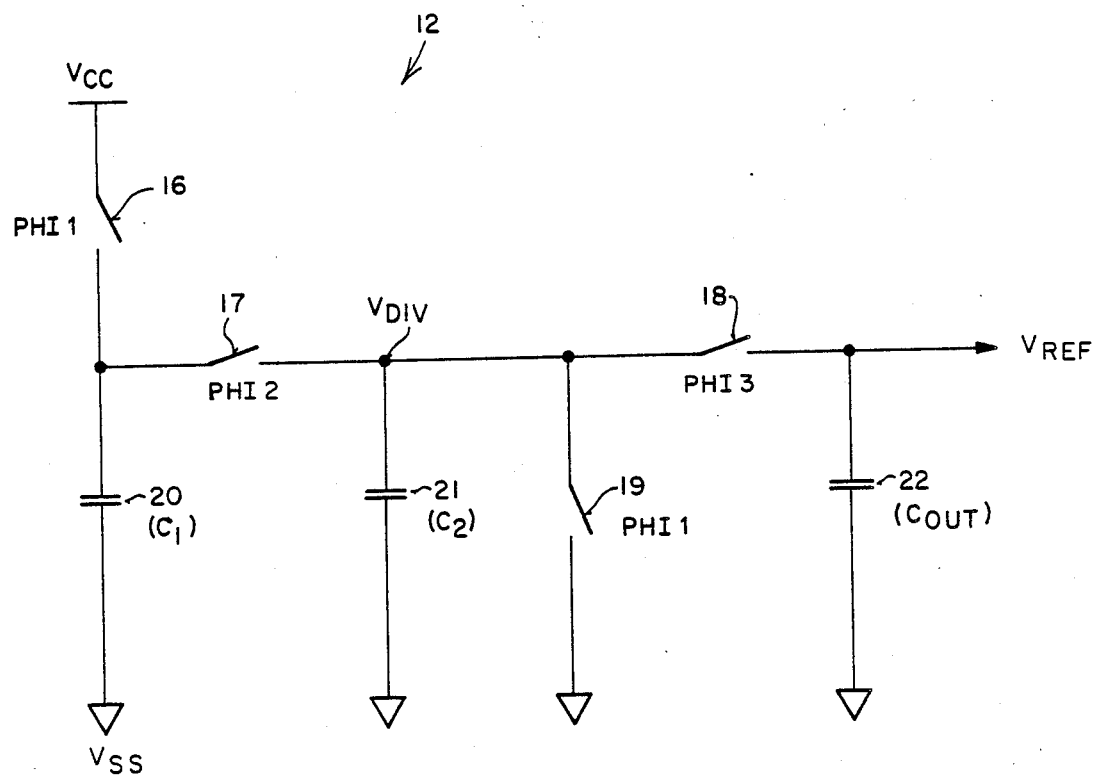
FIG_2

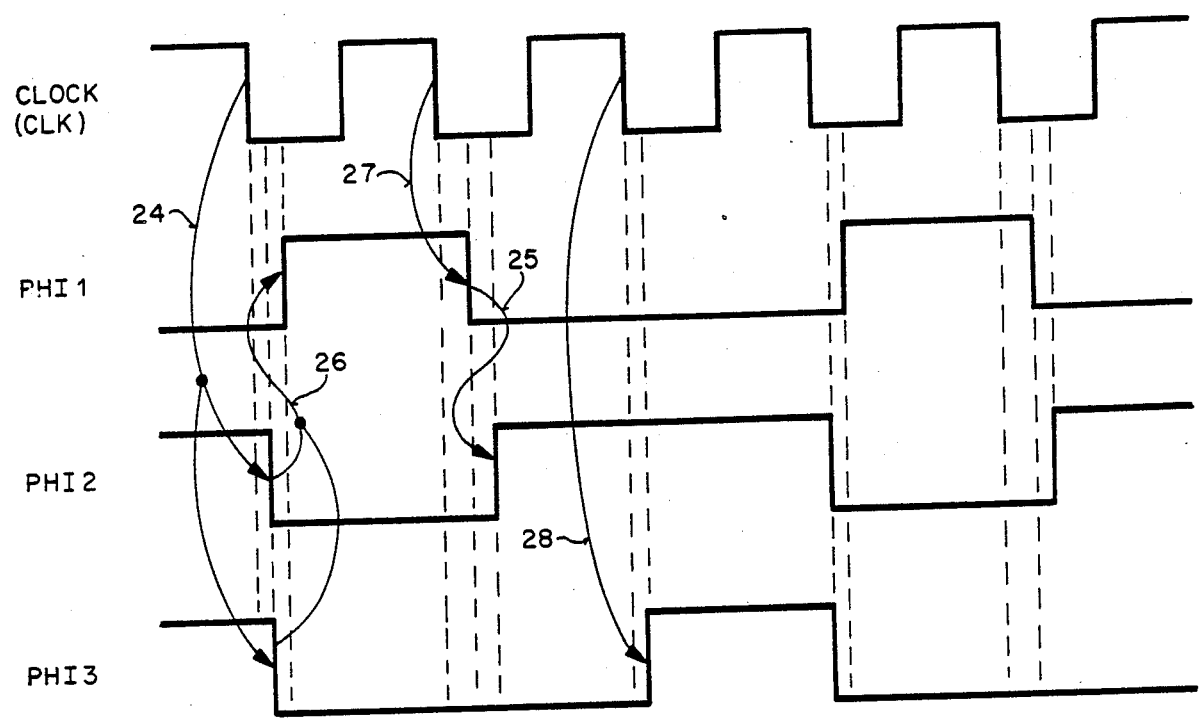
FIG_3
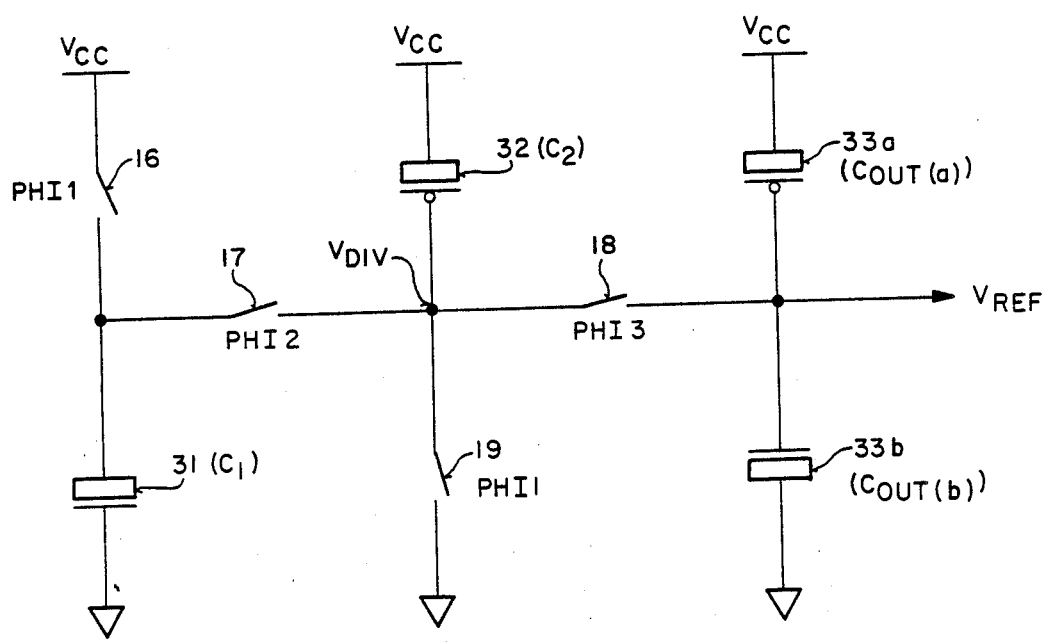
FIG_4

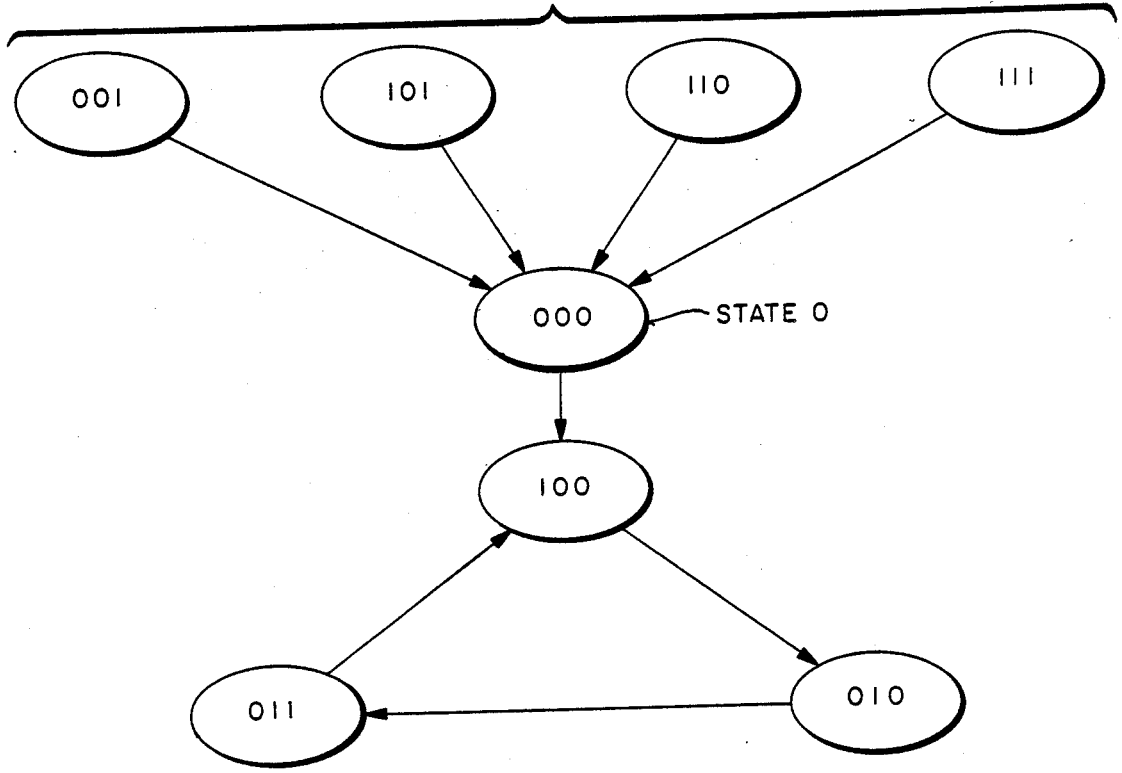
FIG_5
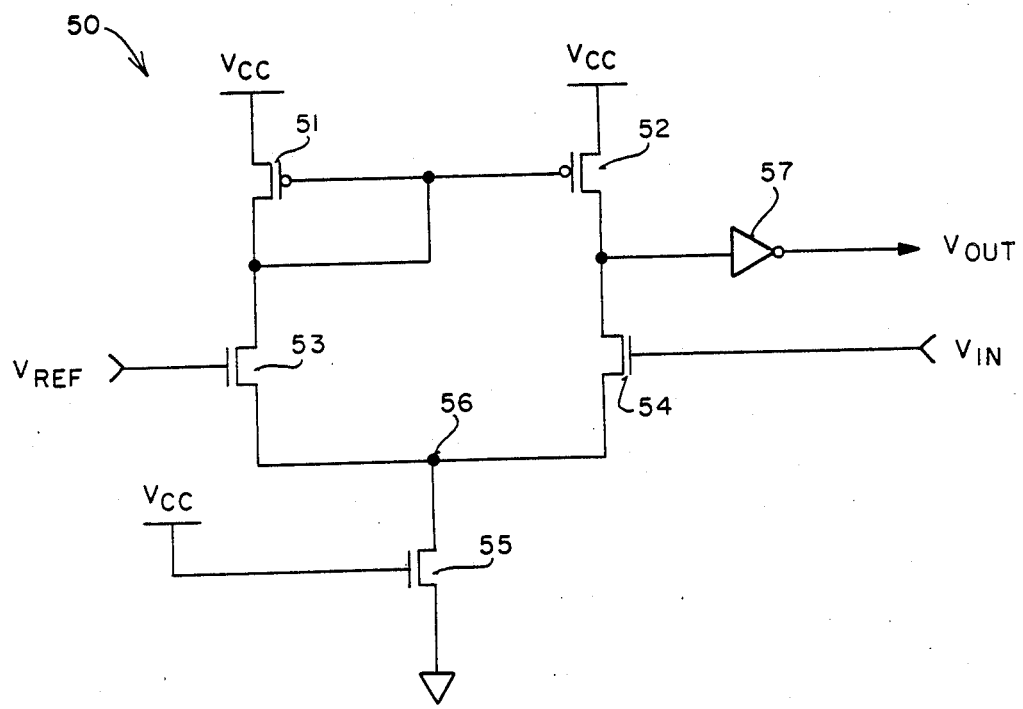
FIG_7 (PRIOR ART)

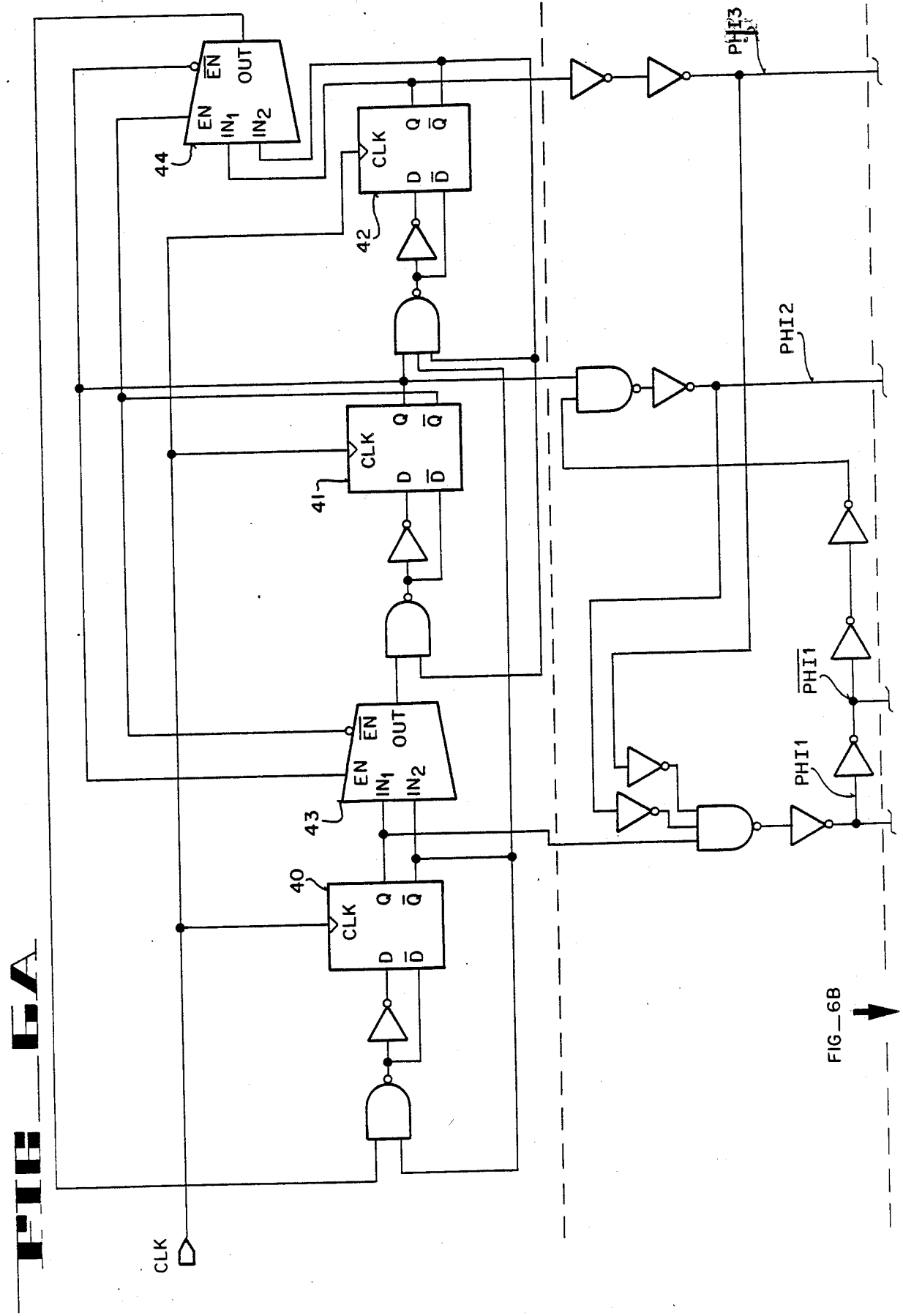

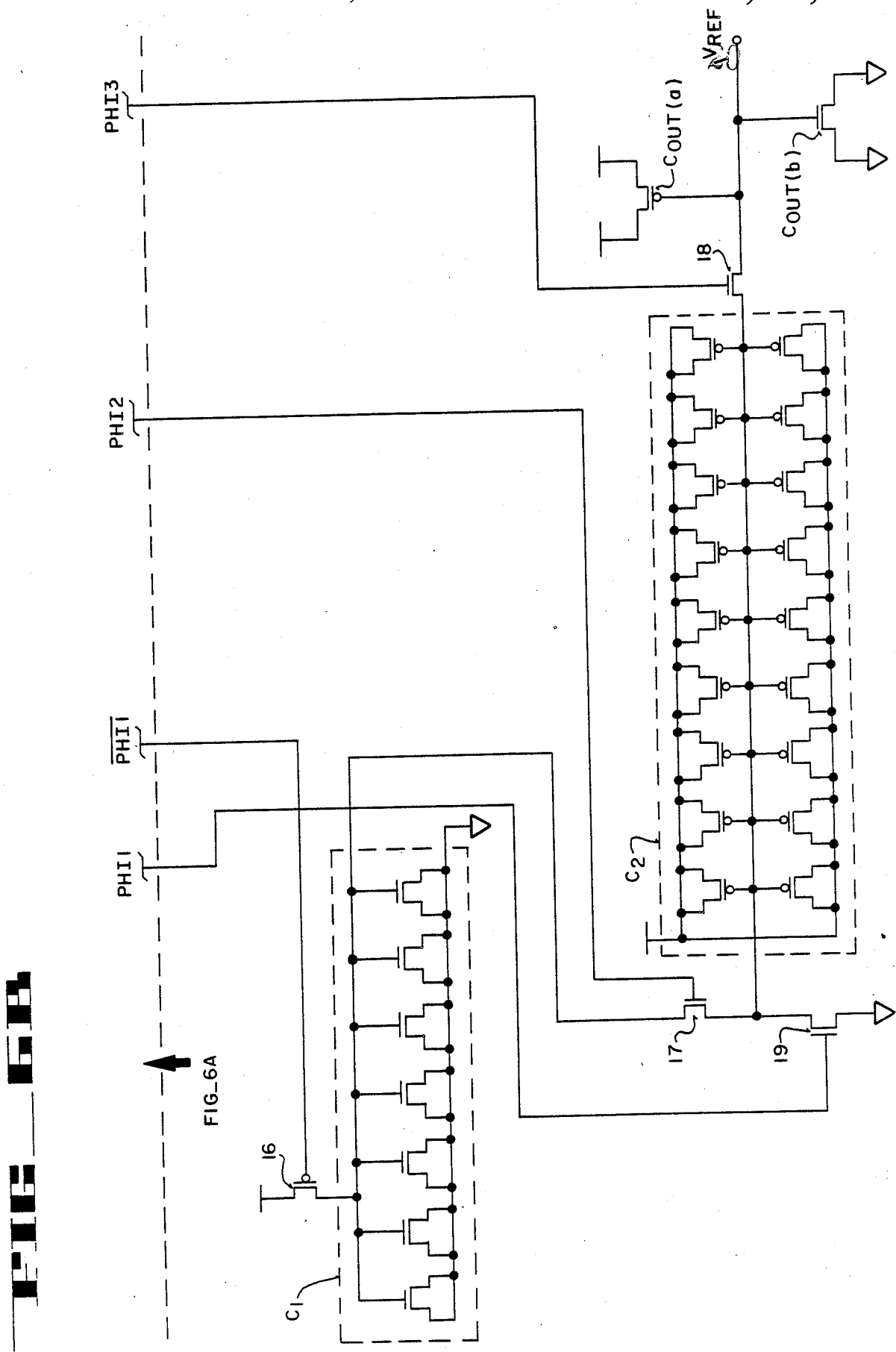
FIG_6B

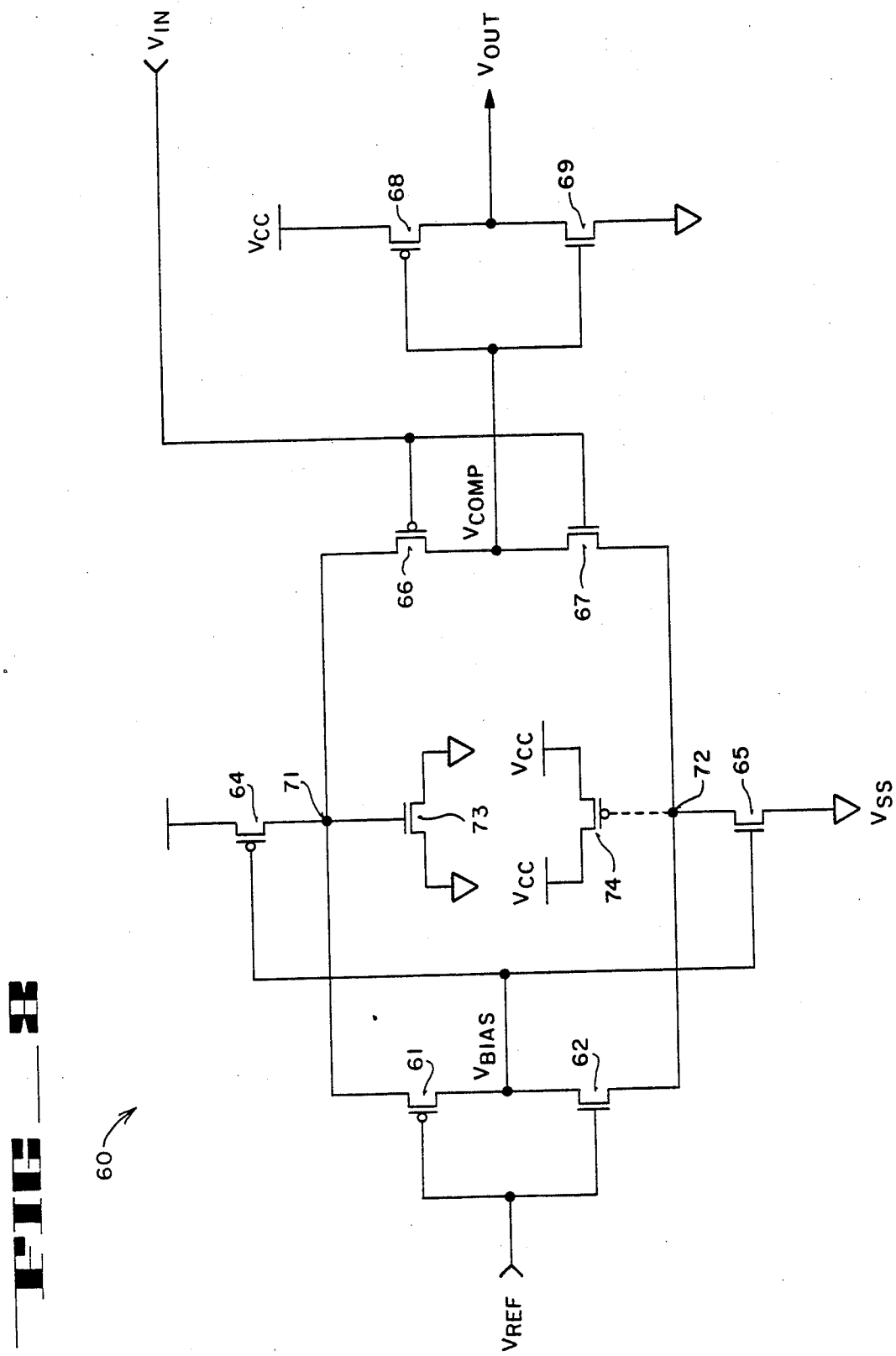
FIG—11

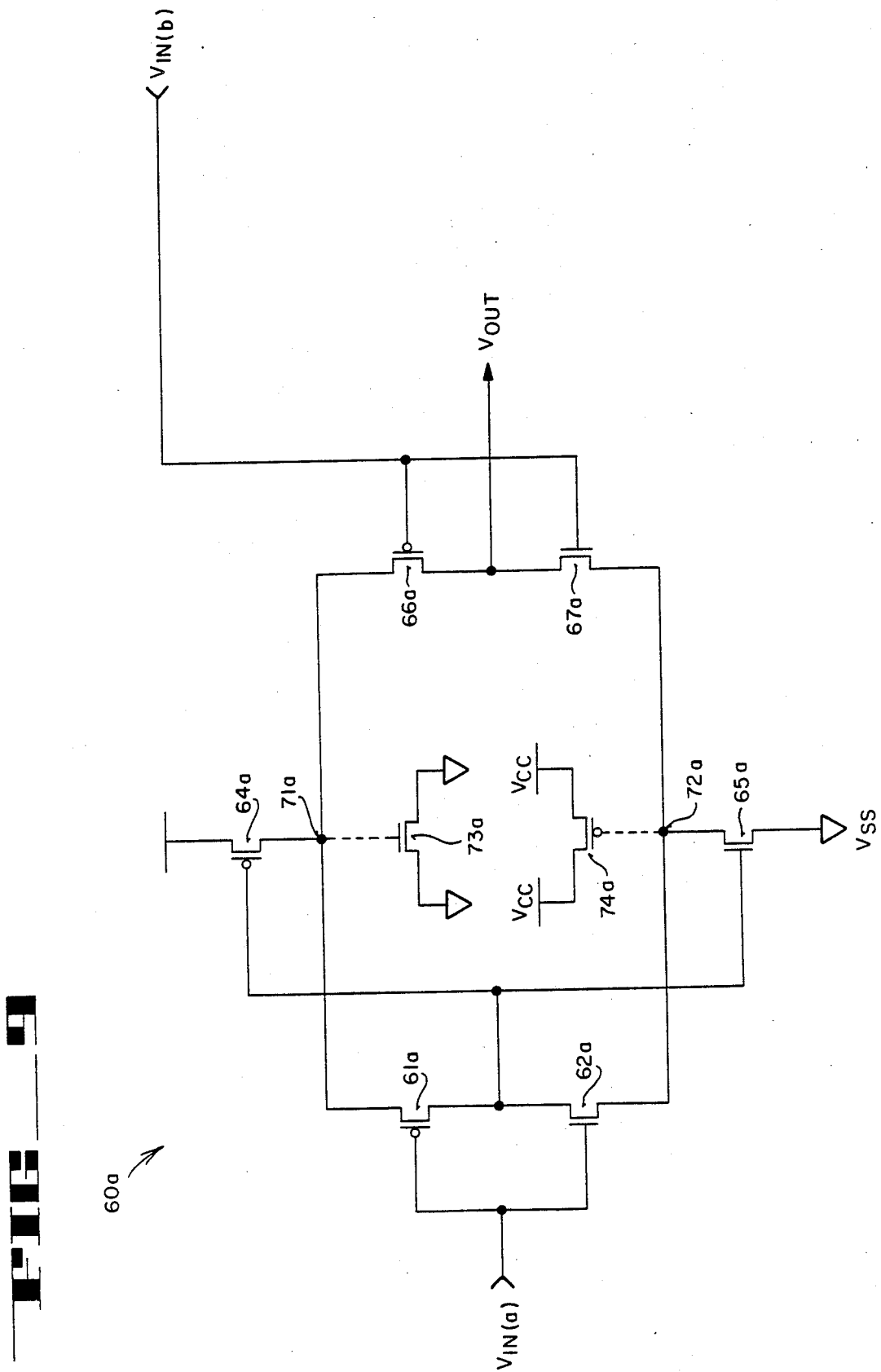

SELF-BIASED, HIGH-GAIN DIFFERENTIAL AMPLIFIER WITH FEEDBACK

This is a continuation of application Ser. No. 207,668 filed June 16, 1988, now abandoned.

BACKGROUND OF THE INVENTION

1. Field of the invention

The present invention relates to the field of MOS integrated amplifiers and more specifically to input buffers utilizing differential amplifiers.

2. Prior Art

Various input buffer amplifiers for buffering an input signal prior to coupling that signal to other circuitry are well known in the prior art. Some of these input buffer amplifiers are also termed as a level shifter, wherein input voltage levels are shifted to be compatible with voltage levels of the associated circuitry. For example, many input voltage levels are specified as being compatible with standard transistor-transistor-logic (TTL) logic levels, that is, a logic threshold of 1.4 volts with a margin of 0.6 volts about the threshold. A typical high logic level TTL signal can be as low as 2.0 volts (VIH parameter), while a low logic level TTL signal can be as high as 0.8 volts (VIL parameter). However, when this TTL level signal is to be used in conjunction with complementary metal oxide semiconductor (CMOS) circuitry, the input levels must be changed to be compatible with the CMOS circuit. Typical CMOS logic thresholds vary approximately from 2.0 to 3.0 volts, while the margin around the threshold can be substantially equal to the difference between the threshold and the supply rails. An input buffer functions to translate the TTL compatible levels of the inputs to the CMOS compatible levels for use with CMOS circuitry inside a CMOS chip. This CMOS chip also includes the input buffer on the chip.

In designing a built-in logic-threshold level translator in a prior art input buffer, the buffers are built to be sensitive to input levels which are above or below the typically-specified threshold margin of 0.6 volts. Prior art implementations of input buffers are characterized by complex connections of carefully sized devices for obtaining proper performance. However, problems encountered in achieving level translation in prior art input buffers result in high dependence of the DC input parameters VIL and VIH on variations in processing and temperature. Further, the complexity of most input buffer configurations results in circuits which are generally not of high speed. In order to obtain the requisite speed, the circuits must be increased in size, which generally is accompanied by an increase of power dissipation.

SUMMARY OF THE PRESENT INVENTION

The present invention provides for a CMOS input buffer utilizing a switched-capacitor reference voltage generator and a differential amplifier which functions as a comparator. The present invention also describes a self-biased, high-gain differential amplifier which is substantially immune to process, temperature and supply voltage variations. The reference voltage generator provides a reference voltage to the signal comparator and this voltage is utilized as the switching point for the comparator. An input voltage to the comparator is typically a TTL level signal and an output voltage from the comparator provides a CMOS compatible signal corresponding to the input signal. When the input voltage is above the reference voltage level, the comparator generates a first state of the CMOS output. When the input voltage is below the reference voltage level, the comparator generates a second state of the CMOS output. A plurality of comparators are used to provide for a plurality of buffers, but only a single reference voltage generator is coupled to the plurality of comparators.

The reference voltage generator of the present invention utilizes a switched-capacitor voltage divider circuit to provide the reference voltage. In the switched-capacitor reference voltage generator, capacitors are charged and discharged according to activation and deactivation of various switches. These switches are controlled by clocking signals, which have their timing determined by a finite state machine. The voltage division for generating the reference voltage from a supply voltage is determined by a ratio of two capacitors, $C_1$ and $C_2$. The preferred embodiment utilizes a series of n-type devices for one of the capacitors, and a series of p-type devices for the other capacitor. By using a grouping of smaller "unit" capacitors for the n- and p-type devices, the reference voltage generator is made substantially immune to process and temperature variations.

Although various prior art signal comparators can be used to practice the present invention, the preferred embodiment utilizes a self-biased, high-gain differential amplifier. The self-biased, high-gain differential amplifier is comprised of a pair of CMOS transistors for accepting the reference voltage from the reference voltage generator and operating in the active region to provide a self-biased biasing voltage to a second pair of CMOS transistors. The second pair of CMOS transistors provide a negative feedback to the input pair. The self-biasing technique and the negative feedback technique provided assure that the amplifier is substantially immune to process and temperature variations. A third pair of CMOS transistors is coupled to accept an input voltage and generates an output to drive an output pair of CMOS transistors. The output driving signal will depend on the relation of the input voltage to the biasing voltage, which is determined by the reference voltage.

The self-biased, high-gain differential amplifier can be used in other applications, such as a general-purpose differential amplifier and front end for an operational amplifier.

BRIEF DESCRIPTION OF THE DRAWINGS

FIG. 1 is a block diagram illustrating a reference voltage generator and signal comparators of the present invention.

FIG. 2 is a circuit schematic diagram of the reference voltage generator of the present invention implemented in a switched-capacitor voltage divider network.

FIG. 3 is a waveform diagram showing various clocking signals which are used to operate switches of the switched-capacitor network of the reference voltage generator of the present invention.

FIG. 4 is a circuit schematic diagram of the switched-capacitor network used in the reference voltage generator of the preferred embodiment.

FIG. 5 is a state variable diagram showing the various states of the reference voltage generator of the present invention.

FIG. 6A and 6B are circuit schematic diagram showing the implementation of the preferred embodiment of FIG. 4.

FIG. 7 is a prior art comparator circuit utilized as a signal comparator of FIG. 1.

FIG. 8 is a circuit schematic diagram of a self-biased, high-gain differential amplifier of the preferred embodiment.

FIG. 9 is a circuit diagram of the self-biased, high-gain differential amplifier configured for use as a general-purpose differential amplifier.

DETAILED DESCRIPTION OF THE INVENTION

An input buffer configuration for providing CMOS compatible signals from an input signal and the use of a self-biased high-gain differential amplifier are described. In the following description, numerous specific details are set forth such as specific circuit components, signal levels, etc., to provide a thorough understanding of the present invention. It will be obvious, however, to one skilled in the art that the present invention may be practiced without these specific details. In other instances, processing steps, control lines, and well-known structures have not been set forth in detail in order not to obscure the present invention in unnecessary detail.

Referring to FIG. 1, an input buffer 10 of the present invention is shown. The buffer 10, as implemented in the preferred embodiment, is a single integrated circuit. Buffer 10 is comprised of a plurality of signal comparators 11, which provide for a plurality of input buffers, and a reference voltage generator 12. Reference voltage generator 12 generates a reference voltage $V_{REF}$, which provides for a reference voltage level to signal comparators 11. The actual number of signal comparators 11 coupled to reference voltage generator 12 is a design choice. For simplicity, the following description will refer to a single comparator 11, but it is to be understood that the description applies to each of the comparators. Further, each comparator 11 has its own $V_{IN}$ and $V_{OUT}$, as is shown in FIG. 1.

Signal comparator 11 is coupled to accept an input signal $V_{IN}$ and to provide $V_{OUT}$ as an output signal. $V_{IN}$ is typically of a signal level which is compatible with TTL and $V_{OUT}$ is a CMOS level compatible signal. However, signal comparator 11 can be designed to function with various input signal levels and to translate these signal levels to a CMOS compatible signal $V_{OUT}$.

The reference voltage generator 12 provides the reference voltage $V_{REF}$, which is nominally equal to the specified logic threshold of $V_{IN}$. This $V_{REF}$ signal is used to set the comparison reference signal required by signal comparator 11. Comparator 11 compares $V_{IN}$ to $V_{REF}$. If $V_{IN}$ exceeds $V_{REF}$, then $V_{OUT}$ is at a first output state. Conversely, if $V_{IN}$ does not exceed $V_{REF}$ then $V_{OUT}$ is at a second output state.

For example, when $V_{IN}$ is a TTL level signal, the high logic level VIH can be as low as 2.0 volts, while the low logic level, VIL, can be as high as 0.8 volts. A threshold level of 1.4 volts can be chosen as the value of $V_{REF}$ such that $V_{IN}$ levels greater than 1.4 volts are treated as VIH and $V_{IN}$ levels below 1.4 volts are treated as VIL. It is to be appreciated that a TTL level example is chosen here; however, the present invention can be utilized to operate with various input logic signal level schemes. The value of the reference voltage $V_{REF}$ is a design choice, chosen to select a threshold level between VIL and VIH of the input signal $V_{IN}$.

Reference Voltage Generator

Referring to FIG. 2, a preferred embodiment of the reference voltage generator 12 of FIG. 1 is shown. Generator 12 is actually a precision switched-capacitor voltage divider, which divides a voltage source potential, such as VCC, to the desired $V_{REF}$ value. Generator 12 of the preferred embodiment is comprised of a plurality of switches and capacitors. A switch 16 and a capacitor 20 are coupled in series between a voltage source, such as VCC, and its return VSS, which is ground in this instance. Two switches 17 and 18 are coupled in series between the junction of switch 16 and capacitor 20 and the output line which provides $V_{REF}$. A capacitor 22 is coupled between the output line and ground. At the junction of switches 17 and 18, a switch 19 and a capacitor 21 are coupled in parallel between the function and ground.

As used in the preferred embodiment, switches 16 and 19 operate in conjunction with clock phase PHI1, switch 17 with clock phase PHI2 and switch 18 with clock phase PHI3. Also, for simplicity in discussing the various equations as they apply to circuitry of the various embodiments, references $C_1$, $C_2$ and $C_{OUT}$ are also utilized. In FIG. 2, capacitors 20, 21 and 22 are equivalent to $C_1$, $C_2$ and $C_{OUT}$, respectively.

Also referring to FIG. 3, waveforms for the three clock phases PHI1, PHI2 and PHI3 are shown in reference to the timing of system clock CLK. Each of the switches 16–19 is in the closed position when its respective clock phase is in the high state and, conversely, each of the switches 16–19 is in the open position when its respective clock phase is in the low state.

The switched capacitor divider circuit of FIG. 2 operates as follows. During the positive going portion of PHI1, switch 16 is closed and capacitor $C_1$ charges toward VCC. During this period, phase PHI2 is in its low state and switch 17 is open. However, because switch 19 is closed due to PHI1 being high, capacitor $C_2$ discharges to ground. The pulsewidth duration of PHI1 is of sufficient length for the charging/discharging transients to dissipate completely. At the end of the PHI1 cycle, the charges appearing on the two capacitors $C_1$ and $C_2$ are determined by $$Q_1 = C_1 \cdot VCC \tag{1a}$$

$$Q_2 = 0, \tag{1b}$$

where $Q_1$ and $Q_2$ are the charges on capacitors $C_1$ and $C_2$, respectively.

When switches 16 and 19 open as PHI1 transitions to its low state, PHI2 then transitions to its high state closing switch 17. During the time PHI2 is high, capacitors $C_1$ and $C_2$ are shorted together and charge flows out of $C_1$ and into $C_2$. After the current transient has dissipated, the charges on the two capacitors $C_1$ and $C_2$ are given by $$Q_1 = C_1 \cdot V_{DIV} \tag{2a}$$

$$Q_2 = C_2 \cdot V_{DIV}. \tag{2b}$$

By charge conservation, the sum of the charges of the two capacitors $C_1$ and $C_2$ at the end of the PHI1 phase must be exactly equal to the sum of the charges of the two capacitors $C_1$ and $C_2$ at the end of the PHI2 phase. That is, $$C_1 * VCC = (C_1 + C_2) V_{DIV}. \quad (3)$$

Then, solving Equation 3 for $V_{DIV}$, the following is obtained.

$$V_{DIV} = VCC/(1 + C_2/C_1). \quad (4)$$

Then, while PHI2 is still high and PHI1 is still low, PHI3 goes to its high state closing switch 18. At this point switches 16 and 19 are open while switches 17 and 18 are closed, resulting in capacitors $C_1$ and $C_2$ being coupled to the output capacitor $C_{OUT}$. In reality, capacitor $C_{OUT}$ represents the actual output capacitance, which includes the combined input capacitance of all of the input buffer lead capacitance present on the interconnection between the reference voltage generator 12 and the input capacitance of the signal comparator 11, as well as any other stray capacitance present.

Typically, the value of the output capacitance as represented by capacitor $C_{OUT}$ is much larger than the combined capacitance of capacitors $C_1$ and $C_2$. Therefore, the charge transferred from capacitors $C_1$ and $C_2$ to capacitor $C_{OUT}$ will charge capacitor $C_{OUT}$ only slightly. However, with the repetitive execution of the three phase operation represented by PHI1, PHI2 and PHI3 as shown in FIG. 3, capacitor $C_{OUT}$ will slowly charge (or discharge, if for some reason $V_{REF}$ is greater than $V_{DIV}$) to $V_{DIV}$, much in the same way a capacitor is charged through a large resistance.

From an analysis of the charge transfer characteristic from capacitors $C_1$ and $C_2$ to capacitor $C_{OUT}$, the voltage on capacitor $C_{OUT}$ approaches $V_{DIV}$ according to $$V_{REF}(n) = k^n * V_{REF}(0) + (1 - k^n) V_{DIV}, \quad (5)$$

where $V_{REF}(n)$ is the voltage on capacitor $C_{OUT}$ after n repetitions of the three phase operation, $V_{REF}(0)$ is the initial voltage on capacitor $C_{OUT}$ (usually 0 volts) and k equals $C_{OUT}/(C_1 + C_2 + C_{OUT})$. Because k is less then unity, $k^n$ approaches 0 in the limit and, therefore, $V_{REF}$ approaches $V_{DIV}$ in the limit. $V_{REF}$ is the actual reference voltage provided to all of the input buffers on the chip as an output of generator 12 to signal comparator 11.

Solving Equation 5 for n, and letting $V_{REF}(0)$ be 0 volt, the result obtained is $$n = \ln(1-a)/\ln k, \quad (6)$$

where "a" equals $V_{REF}(n)/V_{DIV}$ and ln is the natural logarithm. By using Equation 6, the time required for $V_{REF}$ to approach $V_{DIV}$ within an acceptable tolerance can be estimated.

The actual timing sequence is shown in FIG. 3. The timing separation of the leading and trailing edges of the various pulses of the four waveforms are distinguished by the dotted lines. It is to be noted that some finite time period occurs between the time PHI1 goes low and PHI2 going high, as well as between PHI2 and PHI3 going low to PHI1 going high. This time separation is necessary to ensure that various switches are placed in a given position before other switches change states.

By example, if a reference voltage of 1.4 volts is to be generated by dividing down a VCC value of 5.0 volts, the required ratio of $C_1$ to $C_2$ is found from Equation 4 to be equal to 18/7 (2.571428 . . . ). Therefore, it is the ratio of the capacitance values of capacitor $C_1$ and $C_2$ which determines the value of $V_{REF}$ in reference to VCC.

In the practice of the present invention $V_{REF}$ has negligible dependence on temperature and processing variations, but it is directly dependent on VCC variations, such that an X% change in VCC causes an X% change in $V_{REF}$. For the example, because VCC is specified generally to vary no more than ±10%, $V_{REF}$ will vary no more than ±10%, or ±0.14 volts for $V_{REF}$ equal to 1.4 volts nominal.

The present invention utilizes metal oxide semiconductor (MOS) technology to implement the circuit shown in FIG. 2. A MOS capacitor may be implemented with an n-type device whose source and drain are coupled to VSS, or with a p-type device whose source and drain are coupled to VCC. However, an MOS capacitor behaves in a non-linear fashion for gate voltages below the threshold voltage of that device. Specifically, for gate voltages below the threshold voltage, the capacitance of the device is typically low, while in the region of the threshold voltage, the capacitance rises sharply until the capacitance value levels off at its asymptotic value.

The charge on the gate of an MOS capacitor is approximated by $$Q = \begin{cases} 0, & \text{for } V_{GATE} < V_T \\ C(V_{GATE} - V_T), & \text{for } V_{GATE} > \text{ or } = V_T, \end{cases} \quad \text{(Equation 7)}$$

where Q is the charge stored on the device, C is the asymptotic capacitance of the device, $V_{GATE}$ is the voltage applied to the gate of the device, and $V_T$ is the threshold voltage of the device.

If both capacitors $C_1$ and $C_2$ are implemented as n-type MOS devices, then Equation 7 is used to calculate the charges on these two devices at the end of the PHI1 cycle and also at the end of the PHI2 cycle. At the end of PHI1, the charges on the two devices $C_1$ and $C_2$ are given by $$Q_1 = C_1(VCC - V_T) \quad (8a)$$

$$Q_2 = 0. \quad (8b)$$

At the end of PHI2, the charges on the two capacitors $C_1$ and $C_2$ are given by $$Q_1 = C_1(V_{DIV} - V_T) \quad (9a)$$

$$Q_2 = C_2(V_{DIV} - V_T). \quad (9b)$$

Invoking charge conservation on Equations 8a, 8b, 9a and 9b, and solving for $V_{DIV}$, the following is obtained $$V_{DIV} = \frac{VCC}{1 + C_2/C_1} + \frac{V_T}{1 + C_1/C_2}. \quad \text{(Equation 10)}$$

However, by applying Equation 10, $V_{DIV}$ will result in a large error caused by the threshold voltage $V_T$ of the two devices. For example, if $V_T$ equals 0.7 volts and the ratio $C_2/C_1$ equals 18/7, then $V_{DIV}$ from Equation 10 will equal 1.90 volts. That is, the threshold voltage has caused an error to $V_{DIV}$ of 0.5 volts, which calculates to 0.5/1.4, or approximately 36%.

An attempt can be made to correct this error by increasing the $C_2/C_1$ ratio, such that $V_{DIV}$ is again reduced to 1.4 volts. However, due to the fact that $V_T$ is a highly variable parameter dependent on processing parameters, temperature and VCC, an increase in the ratio would not remove the variability caused by $V_T$. In order to overcome this variability caused by the threshold voltage, the circuit of the preferred embodiment is implemented as a combination of an n-type device and a p-type device.

Referring to FIG. 4, a switched-capacitor divider circuit of the preferred embodiment is shown utilizing both n-type and p-type devices. The circuit of FIG. 4 is equivalent to that of the circuit of FIG. 2, wherein $C_1$ is implemented as an n-type capacitor 31 and $C_2$ is implemented as a p-type capacitor 32. Because capacitor 32 is a p-type device it is coupled from the junction of switches 17 and 18 to VCC instead of to VSS as is shown in FIG. 2. $C_{OUT}$ of FIG. 2 is implemented as a p-n capacitor pair comprised of p-type device 33a and n-type device 33b. N-type device 33b is coupled between the output line and VSS, whereas p-type device 33a is coupled between the output line and VCC. The two devices 33a and 33b are equivalent to capacitor $C_{OUT}$ of FIG. 2. Because the dimensions of 33a and 33b are equal, the effects of power supply and ground noise on $V_{REF}$ is symmetrical and is removed from the output $V_{REF}$.

Utilizing the implementation shown in FIG. 4, the charges on $C_1$ and $C_2$ at the end of PHI1 are given by $$Q_1 = C_1(VCC - V_{TN}) \tag{11a}$$

$$Q_2 = -C_2(VCC + V_{TP}), \tag{11b}$$

where $V_{TN}$ is the threshold voltage of $C_1$, and $V_{TP}$ is the threshold voltage of $C_2$ ($V_{TP}$ is a negative quantity because $C_2$ is a p-type device).

At the end of PHI2, the charges on the two devices $C_1$ and $C_2$ are given by $$Q_1 = C_1(V_{DIV} - V_{TN}) \tag{12a}$$

$$Q_2 = -C_2(VCC - V_{DIV} + V_{TP}). \tag{12b}$$

Invoking charge conservation on Equations 11a, 11b, 12a and 12b and solving for $V_{DIV}$, the result obtained is that given by Equation 4, just as if ideal linear capacitors were used. That is, a divider implemented with an n-type device for $C_1$ and a p-type device for $C_2$ will not be sensitive to temperature or processing variations.

An elaboration on the capacitors utilized in the present invention is needed in order to achieve the desired results of the present invention. On account of fringing field effects, the capacitance of a capacitor is not only a function of its area, but also of its circumference. Thus, the capacitance ratio of two capacitors is not generally equal to their area ratio, unless both capacitors are identical in area and circumference. For example, a $C_2/C_1$ ratio of 18/7, which is required in order to obtain a $V_{REF}$ of 1.4 volts, cannot be obtained simply by implementing two capacitors with an area ratio of 18/7. In order to remove the error caused by differing circumferences, small capacitors of fixed dimensions, called "unit" capacitors are used to implement the desired capacitors of the present invention.

Instead of providing the requisite capacitance for a capacitor by setting its dimensions, the capacitance is set by coupling a selected number of unit capacitors in parallel. Two capacitors implemented in this fashion have both an area ratio and a circumference ratio equal to $N_2/N_1$, where $N_1$ is the number of unit capacitors used to implement the first capacitor and $N_2$ is the number of unit capacitors used to implement the second capacitor. Because both the area capacitance and the fringing field capacitance of the two capacitors are related by $N_2/N_1$, the total capacitances of the capacitors are each related by the ratio $N_2/N_1$. By using this unit capacitor technique, the $C_2/C_1$ ratio of the above example of 18/7 is implemented by utilizing eighteen unit capacitors connected in parallel for $C_2$ and seven unit capacitors coupled in parallel for $C_1$.

The reference voltage generator 12 of the preferred embodiment is designed as a finite-state machine having three state variables. The machine states are represented in the state diagram of FIG. 5. Each state variable represents one of the three phases, PHI1, PHI2 and PHI3, in that order. The machine can be in one of the following three states in normal operation:

State 100 = PHI1*PHI2#*PHI3#      (13a)

State 010 = PHI1#*PHI2*PHI3#      (13b)

State 011 = PHI1#*PHI2*PHI3      (13c)

The other five states which can be derived from the three state variables are illegal states.

The state diagram of FIG. 5 is also utilized in the initialization of the reference voltage generator of the present invention. In order for the input buffers to be in a ready state by the time power-up reset is completed in the device, the reference voltage generator 12 must provide a stable reference voltage $V_{REF}$ even prior to the completion of the power-up reset sequence. The three-phase clock generator must be operational prior to the completion of the reset sequence initiated by a reset signal, such that by the time the reset cycle is completed the three-phase clock generator will have already been placed in one of the legal states of the finite-state machine. In order to achieve this requirement, the initialization of the three-phase clock generator to generate $V_{REF}$ cannot rely on the system reset signal.

Because no reset signal is available to force the finite-state machine of the present invention to enter one of the legal states if it is started in an illegal state, the finite-state machine is designed as is shown in FIG. 5. During power-up, if an illegal state occurs, the finite-state machine is designed so that it will automatically recognize that it is in an illegal state and within one clock cycle, enter state 000. Once state 000 has been entered, any further transitions will only occur within one of the three legal states (states 010, 011 and 100), due to the cycling arrangement shown in FIG. 5. It is to be noted that all transitions between states are unqualified regardless of the inputs.

Referring again to FIG. 3, the waveform diagram shows various overlap timings incorporated into the clocking scheme of the present invention. This overlap scheme is used to ensure that a first switch has completely changed its state prior to a second switch changing its state. For example, if PHI2 transitions to a high state before PHI1 has completed transitioning to its low state, $C_1$ can be momentarily shorted to ground, or, in the alternative, $C_2$ could be momentarily shorted to VCC, in which event the sum of the charges on the two capacitors $C_1$ and $C_2$ will have a different value than that which is desired. To prevent such an occurrence, PHI2 is logically forced off until PHI1 has transitioned to its low state, as is shown by arrow 25.

Similarly, if PHI1 transitions to a high state before both PHI2 and PHI3 have completed their transition to their low states, $C_{OUT}$ can be momentarily shorted, thereby, causing an error in the voltage value of $C_{OUT}$. In order to prevent such an error, the present invention causes PHI1 to be logically forced off until PHI2 and PHI3 have both transitioned to their low states, as is shown by arrow 26. The high-to-low transitions of PHI2 and PHI3 follow the trailing edge of the clock pulse as is shown by arrow 24.

It is also to be noted that after PHI1 transitions to its high state following a trailing edge of the clock pulse as shown by arrow 24, the next subsequent trailing edge of the clock pulse causes PHI1 to transition to its low state, as is shown by arrow 27. Also, after PHI2 has transitioned to a high state following the trailing edge of the clock pulse shown by arrow 27, the subsequent trailing edge of the clock pulse causes PHI3 to transition to a high state following a predetermined timelag, as is shown by arrow 28. Then the sequence is repeated at the trailing edge of the next clock pulse.

Referring to FIG. 6, a circuit diagram of the reference voltage generator 12 of FIG. 1, as implemented according to FIG. 4, is shown as a circuit of the preferred embodiment. Seven unit capacitors formed from n-type devices comprise capacitor $C_1$, while 18 unit capacitors formed from p-type devices comprise capacitor $C_2$. A p-type device forms switch 16 while n-type devices form switches 17, 18 and 19. Switches 16–19 and capacitors $C_1$ and $C_2$ are coupled electrically as is shown in the diagram of FIG. 4. The output capacitor $C_{OUT}$ is split between a p-type device forming $C_{OUT}(a)$ and an n-type device forming $C_{OUT}(b)$ as is also shown in FIG. 4. The various transistor switches 16–19 are controlled by clocking signals PHI1, PHI2 and PHI3, which are coupled to the appropriate gates of transistors 16–18.

The rest of the circuit of FIG. 6 is comprised of three D-type flip-flops, two multiplexors and various combinatorial logic gates to provide the finite-state machine of FIG. 5. A D-type flip-flop 40 has its outputs coupled to multiplexor 43, which is then coupled to D-type flip-flop 41. The output of flip-flop 41 is coupled to D-type flip-flop 42, which output is then coupled to multiplexor 44, which then has its output coupled back as an input to flip-flop 40. A number of NAND gates and inverters are included in this flip-flop/multiplexor loop to provide the necessary logic and time delays to implement the state diagram of FIG. 5.

The clock signal CLK of FIG. 3 is coupled to the three flip-flops 40–42 to provide the necessary clocking of these flip-flops 40–42. The output of flip-flop 40 is utilized to provide the signal PHI1 to drive the gates of transistors representing switches 16 and 19. Signal PHI2 is derived from the output of the second flip-flop 41, which is then used to drive the gate of the transistor representing switch 17. PHI3 is derived from the output of the third flip-flop 42 and is then used to control the gate of the transistor representing switch 18. A number of NAND gates and inverters are utilized to provide the necessary logic and delays for the generation of PHI1, PHI2 and PHI3. The necessary delays shown in FIG. 3 are derived in the circuit of FIG. 6. PHI1 is coupled back as one of the inputs for providing PHI2, such that the necessary delay for generating PHI2 from PHI1 is provided by this delay sequence. In order to provide the delay of PHI1, both PHI2 and PHI3 are coupled as inputs for generating PHI1. Therefore, in FIG. 6 the finite-state machine is represented by flip-flops 40–42, multiplexors 43–44 and the associated combinatorial logic in the looping circuit of the upper portion of the schematic. The necessary time delays to prevent the overlap of the operation of the various switches 16–19 are provided by the combinatorial logic coupling the looping circuit to the switched capacitor circuit at the bottom portion of the drawing of FIG. 6. It is to be appreciated that although a particular embodiment is shown as the preferred embodiment in FIG. 6, various other schemes can be implemented without departing from the spirit and scope of the present invention.

The reference voltage $V_{REF}$, which is provided as an output from reference voltage generator 12, is then coupled to signal comparator 11 as shown in FIG. 1. The signal comparator 11 can be any of a variety of comparators which are used to toggle between two states depending on the value of the input voltage. Although a variety of prior art comparators can be utilized, one prior art comparator circuit 50 is shown in FIG. 7. A p-channel transistor 51 and a n-channel transistor 53 are coupled in series between a voltage supply source, such as VCC, and node 56. A second pair of transistors formed by p-channel transistor 52 and an n-channel transistor 54 are coupled in series between the voltage source and node 56 also. $V_{REF}$ from the reference voltage generator 12 is coupled to the gate of transistor 53. The drains of transistors 51 and 53 are coupled together to the gates of transistors 51 and 52. The $V_{IN}$ signal is coupled to the gate of transistor 54, and the drains of transistors 52 and 54, are coupled as an output $V_{OUT}$ through inverter 57. Transistor 55 is coupled between node 56 and VSS, which in this case is ground, and the gate of transistor 55 is coupled to VCC. The operation of this circuit is simply controlled by the value of $V_{REF}$ and $V_{IN}$. Whenever $V_{IN}$ is less than the value of $V_{REF}$, $V_{OUT}$ transitions to one CMOS logic state, and when $V_{IN}$ is greater than $V_{REF}$, $V_{OUT}$ transitions to the other CMOS logic state.

Self-Biased, High-Gain Differential Amplifier

Although the above-described CMOS input buffer circuitry, which includes the reference voltage generator of the present invention, can operate with a prior art comparator circuit, a high-speed comparator of the present invention functions to provide an improvement over prior art comparators. Referring to FIG. 8, a high speed comparator circuit 60 of the present invention is shown. The purpose of comparator 60 is to convert $V_{IN}$, which typically has TTL level signals, to a CMOS compatible $V_{OUT}$, wherein the switching level is determined by the value of $V_{REF}$. A CMOS transistor pair comprised of p-type transistor 61 and n-type transistor 62 are coupled in series between nodes 71 and 72. Node 71 is coupled to a voltage source, such as VCC, through a p-type transistor 64. Node 72 is coupled to VSS, which in this case is ground, through an n-type transistor 65. The drains of transistors 61 and 62 are coupled together to the gates of transistors 64 and 65. The gates of transistors 61 and 62 are driven by the signal $V_{REF}$.

Also coupled in series between nodes 71 and 72 is another pair of CMOS transistors formed by p-type transistor 66 and n-type transistor 67. The gates of transistors 66 and 67 are coupled together to receive $V_{IN}$, and the drains of these two transistors 66 and 67 are coupled to drive the gates of a third set of CMOS transistors 68 and 69. A signal $V_{COMP}$ is obtained at the drain junction of transistors 66 and 67. $V_{COMP}$ is coupled to drive the gates of a CMOS inverter formed by transistors 68 and 69. P-type transistor 68 and n-type transistor 69 are coupled in series between VCC and VSS, and $V_{OUT}$ is obtained from their drain junction.

The comparator 60 is actually a differential amplifier. In operation, transistors 61 and 62 are identical in size and structure to transistors 66 and 67, respectively. This is done so that both CMOS pairs have identical electrical behavior. Transistors 64 and 65 are utilized to provide bias for transistors 61, 62, 66 and 67. Because transistors 61 and 62 conduct together, the connection at their drains provides a biasing voltage $V_{BIAS}$, which is then coupled to the gates of transistors 64 and 65. This results in a self-biasing technique, wherein transistors 61 and 62 operate in their active regions in spite of variations attributed to processing and temperature.

The size of transistors 61, 62, 64 and 65 are chosen so that under typical conditions for processing, temperature and VCC, transistors 61 and 62 are biased substantially in the center of their active region. Under certain conditions, the bias point of transistors 61 and 62 will shift away from the center of the active region, either above or below the center, depending on the nature of the conditions. However, due to the negative feedback provided by transistors 64 and 65 at nodes 71 and 72, and through the negative feedback inherent in the self-biasing technique, the shift in the bias point will be minimized, and the bias point will remain within the active region of transistors 61 and 62.

Because transistors 66 and 67 are identical in all respects to transistors 61 and 62, when $V_{IN}$ is equal to $V_{REF}$, transistors 66 and 67 will become biased identically to transistors 61 and 62. That is, transistors 66 and 67 will also be biased in the active region. Therefore, the $V_{COMP}$ voltage on the drain junction of transistors 66 and 67 will be equal to the voltage $V_{BIAS}$. $V_{BIAS}$, along with $V_{COMP}$, will have a value somewhere between the high state and the low state of $V_{IN}$.

When $V_{IN}$ is made to transition from a low state to a high state, then $V_{COMP}$ will switch from a high level to a low level, with the center of the switching region at or very near to the point where $V_{IN}$ equals $V_{REF}$. Furthermore, the switching characteristic of $V_{COMP}$ will be sharp about the point where $V_{IN}$ equals $V_{REF}$, with $V_{COMP}$ making a full transition from a high state to a low state for a small change in $V_{IN}$. Transistors 68 and 69 serve as an inverter and amplify $V_{COMP}$ further in order to obtain a full output swing from VCC to VSS as $V_{OUT}$.

An n-type device 73 has its gate coupled to node 71 and its drain and source coupled to VSS. Device 73 is coupled to function as a capacitor. When $V_{IN}$ switches from a high state to a low state, $V_{COMP}$ switches from a low state to a high state, and device 73 provides some of the charging current necessary to charge the parasitic capacitance on $V_{COMP}$, thereby speeding the rise time of the comparator. It is to be appreciated that a p-type device 74 can be coupled to node 72 to improve the fall time of the comparator. However, because the fall time of the comparator is much shorter than the rise time without the addition of device 74, the additional improvement in performance is negligible. Therefore as is implemented in the preferred embodiment, device 74 is not utilized.

It is to be appreciated that the differential amplifier 60 can be implemented as the signal comparator 11 of FIG. 1 to provide faster performance for the CMOS input buffer of the present invention. It is to be further appreciated that the self-biased, high-gain differential amplifier of FIG. 8 can be utilized with other circuits other than the reference voltage generator 12 of the present invention and is not limited to the described application of the CMOS input buffer, which is a self-biased high-gain differential amplifier that provides a high-speed comparator.

Referring to FIG. 9, the differential amplifier 60 of FIG. 8 is shown, but in a general differential amplifier configuration. The suffix "a" has been added to the reference numerals of FIG. 8 to designate equivalence. Further the output inverter has been deleted although such inverters can be used. One input $V_{IN}(a)$ is coupled to the gates of transistors 61a and 62a. A second input $V_{IN}(b)$ is coupled to the gates of transistors 66a and 67a. The two inputs can be DC differential inputs or two AC differential inputs.

The two capacitors 73a and 74a improve switching speeds if one of the inputs is connected to a DC level. However, if the inputs are AC, then the capacitors 73a and 74a are not used because they degrade the switching speed.

It is to be appreciated that the self-biased high-gain differential amplifier 60a can be used for various applications, including general purpose differential amplifier, sense amplifiers, front end for operational amplifiers and high-speed comparators. These examples are for illustration only and are not provided to limit the present invention.

Thus, an improved CMOS input buffer utilizing a switched capacitor voltage reference source and a self-biased high-gain differential amplifier circuit is described.

I claim:

1. A differential amplifier for generating an output voltage dependent on an input voltage in relation to a reference voltage comprising:

a first transistor coupled between a first node and a second node and its gate coupled to accept a reference voltage;

a second transistor coupled between said second node and a third node and its gate coupled to accept said reference voltage;

a third transistor coupled between a supply source and said first node and its gate coupled to said second node;

a fourth transistor coupled between said third node and a return of said supply source and its gate coupled to said second node;

wherein said first and second transistors operate in an active region to provide a biasing voltage at said second node and said biasing voltage being coupled to gates of said third and fourth transistors for providing a negative feedback to said first and second transistors at said first and third nodes in order to maintain said first and second transistors in said active region;

a fifth transistor, having its circuit parameters substantially matched to that of said first transistor, coupled between said first node and a fourth node and its gate coupled to accept said input voltage;

a sixth transistor, having its circuit parameters substantially matched to that of said second transistor, coupled between said fourth node an said third node and its gate coupled to said input voltage;

wherein said fourth node provides said output voltage which is dependent on a difference of said input voltage to said reference voltage; and wherein feedback at said first and third nodes causes said fifth and sixth transistors to be biased substantially identical to said first and second transistors and wherein said matching of transistors provides immunity from circuit parameter variations.

2. The differential amplifier of claim 1, wherein said first, third and fifth transistors are p-type devices and said second, fourth and sixth transistors are n-type devices.

3. The differential amplifier of claim 2, wherein due to said first and second transistors operating in said active region with feedback and said fifth and sixth transistors being substantially matched to said first and second transistors, said amplifier is substantially immune to process and temperature variations.

4. The differential amplifier of claim 3, wherein said output of said fifth and sixth transistors is coupled to gates of a seventh and eighth transistors which are coupled in series between said supply source and said return, wherein said seventh and eighth transistors are driven to either of said supply source and its return to provide a complementary-metal-oxide semiconductor (CMOS) output.

5. The differential amplifier of claim 4, wherein a n-type capacitive device is coupled to said first node to increase switching response.

6. The circuit of claim 5, wherein a p-type capacitive device is coupled to said third node to increase switching response.

7. A differential amplifier for generating an output voltage dependent on a first input voltage in relation to a second input voltage comprising:

a first transistor coupled between a first node and a second node and its gate coupled to accept a second input voltage;

a second transistor coupled between said second node and a third node and its gate coupled to accept said second input voltage;

a third transistor coupled between a supply source and said first node and its gate coupled to said second node;

a fourth transistor coupled between said third node and a return of said supply source and its gate coupled to said second node;

wherein said first and second transistors operate in an active region to provide a biasing voltage at said second node and said biasing voltage being coupled to gates of said third and fourth transistors for providing a negative feedback to said first and second transistors at said first and third nodes in order to maintain said first and second transistors in said active region;

a fifth transistor, having its circuit parameters substantially matched to that of said first transistor, coupled between said first node and a fourth node and its gate coupled to accept said first input voltage;

a sixth transistor, having its circuit parameters substantially matched to that of said second transistor, coupled between said fourth node and said third node and its gate coupled to said first input voltage;

wherein said fourth node provides said output voltage which is dependent on a difference of said first input voltage to said second input voltage; and wherein feedback at said first and third nodes causes said fifth and sixth transistor to be biased substantially identical to said first and second transistors and wherein said matching of transistors provides immunity from circuit parameter variations.

8. The differential amplifier of claim 7, wherein said first, third and fifth transistors are p-type devices and said second, fourth and sixth transistors are n-type devices.

9. The differential amplifier of claim 8, wherein due to said first and second transistors operating in said active region with feedback and said fifth and sixth transistors being substantially matched to said first and second transistors, said amplifier is substantially immune to process and temperature variations.

10. The differential amplifier of claim 9, wherein said output of said fifth and sixth transistors is coupled to gates of a seventh and eighth transistors which are coupled in series between said supply source and said return, wherein said seventh and eight transistors are driven to either of said supply source and its return to provide a complementary-metal-oxide semiconductor (CMOS) output.

11. The differential amplifier of claim 10, wherein a n-type capacitive device is coupled to said first node to increase switching response.

12. The circuit of claim 11, wherein a p-type capacitive device is coupled to said third node to increase switching response.

* * * * *